(12) United States Patent
Wang

(10) Patent No.: US 7,800,028 B2
(45) Date of Patent: Sep. 21, 2010

(54) CONTROLLABLE ELECTROTHERMAL ELEMENT OF PTC THICK FILM CIRCUIT

(76) Inventor: Kezheng Wang, 303# No. 13 1st Street of Nanhua, Chancheng District, Foshan, Guangdong 528000 (CN)

( * ) Notice: Subject to any disclaimer, the term of this patent is extended or adjusted under 35 U.S.C. 154(b) by 814 days.

(21) Appl. No.: 11/658,793

(22) PCT Filed: Jul. 15, 2005

(86) PCT No.: PCT/CN2005/001052
§ 371 (c)(1),
(2), (4) Date: Jan. 25, 2007

(87) PCT Pub. No.: WO2006/010317
PCT Pub. Date: Feb. 2, 2006

(65) Prior Publication Data
US 2009/0283511 A1 Nov. 19, 2009

(30) Foreign Application Priority Data
Jul. 28, 2004 (CN) .................. 2004 1 0050830

(51) Int. Cl.
*C09K 5/14* (2006.01)
(52) U.S. Cl. ...................... 219/505; 219/540
(58) Field of Classification Search .............. 219/505, 219/494, 501, 504, 549, 528; 338/25; 428/209
See application file for complete search history.

(56) References Cited

U.S. PATENT DOCUMENTS

| | | | | |
|---|---|---|---|---|
| 5,204,166 A * | 4/1993 | Ito et al. | ...................... | 428/209 |
| 5,354,969 A * | 10/1994 | Akiyama et al. | ............ | 219/541 |
| 6,103,146 A * | 8/2000 | Okamoto | ..................... | 252/514 |
| 6,443,999 B1* | 9/2002 | Cantave et al. | ............. | 29/623.1 |
| 6,723,420 B2* | 4/2004 | Petkie | ......................... | 428/210 |
| 2003/0170432 A1* | 9/2003 | Kobayashi et al. | .......... | 428/209 |
| 2004/0214418 A1* | 10/2004 | Noda et al. | .................. | 438/597 |
| 2005/0029666 A1* | 2/2005 | Kurihara et al. | ............. | 257/772 |

FOREIGN PATENT DOCUMENTS

| | | |
|---|---|---|
| CN | 1143425 | 2/1997 |
| CN | 1490376 | 4/2004 |
| JP | 7-94260 | 4/1995 |

OTHER PUBLICATIONS

Zhang, Weijun et al., "Technology for Thick Film ICs on Stainless Steel Substrates", Electronic Components and Materials, vol. 20, No. 6., Dec. 2001.
International Search Report (mailing date Oct. 27, 2005) and Written Opinion of the International Searching Authority for International Patent Application No. PCT/CN2005/001052, filed on Jul. 15, 2005.

* cited by examiner

*Primary Examiner*—Tu B Hoang
*Assistant Examiner*—Brian Jennison
(74) *Attorney, Agent, or Firm*—Vic Lin; Innovation Capital Law Group, LLP

(57) ABSTRACT

The invention provides a controllable electrothermal element of a PTC thick film circuit which includes a substrate and a serial electronic paste. The serial paste includes a medium and electrode paste. The serial paste consists of a functional phase, an inorganic adhesive phase and an organic carrier. The serial paste further includes PTC paste. The substrate is 1Cr18Ni9 series stainless steel. The serial paste in the form of a thick film prepared on the substrate.

4 Claims, 1 Drawing Sheet

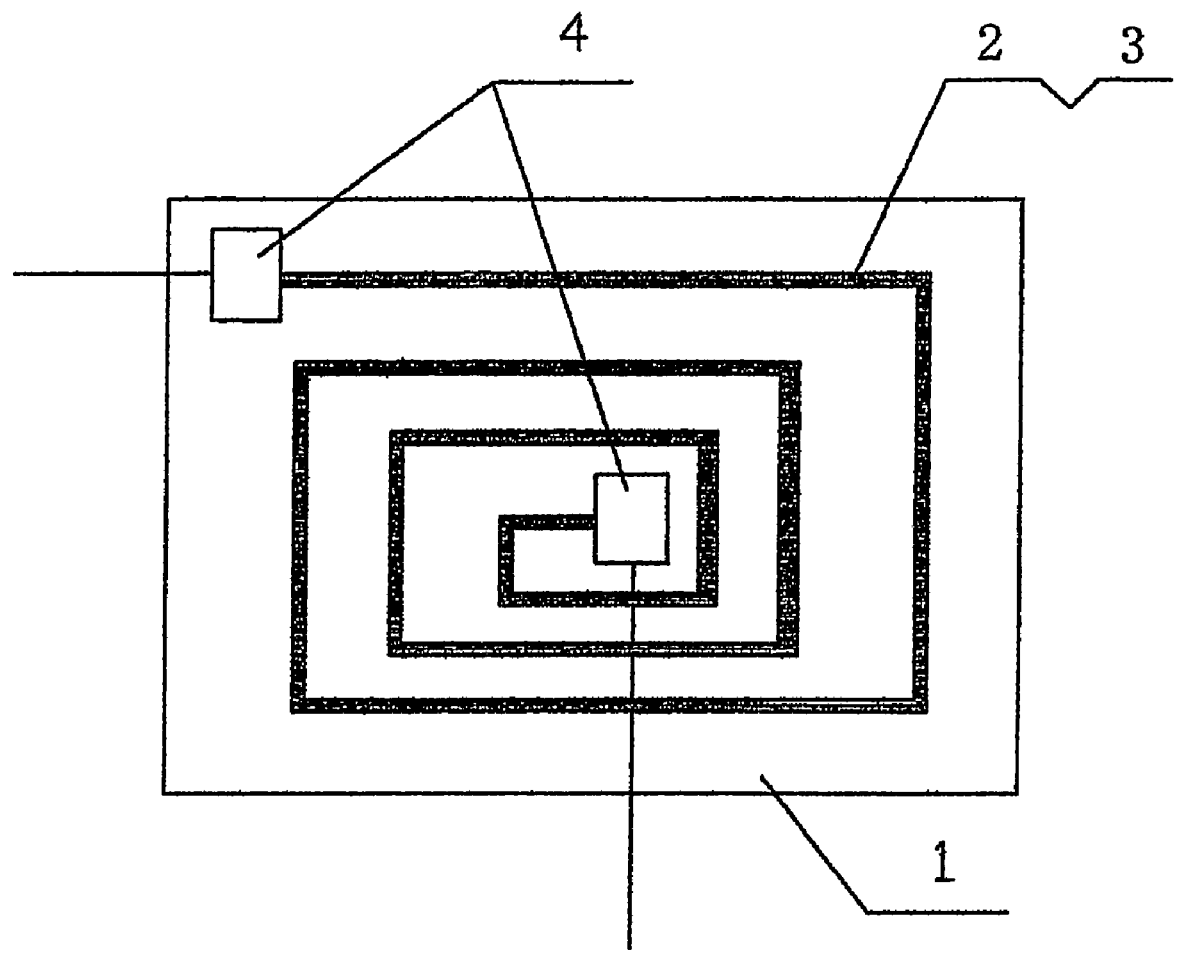

CONTROLLABLE ELECTROTHERMAL ELEMENT OF PTC THICK FILM CIRCUIT

FIELD OF THE INVENTION

The present invention relates to a controllable electrothermal element, and especially relates to a controllable electrothermal element of a PTC thick film circuit.

BACKGROUND OF THE INVENTION

As the electrothermal products are increasingly popular in the fields of household appliances, electrical equipment, electronic aid, motor industry, etc, the application of the electrothermal element is becoming wider and wider. Therefore, the requirement of the performance of every aspect of the electro thermal element is getting higher and higher.

The electrothermal element (mainly nickel chrome) of the prior art has the following disadvantages: Small power density, normally about 15 watt/$cm^2$, which cannot satisfy the need of a high thermal-shock and a low resistance voltage; low toggle speed, most of which have thermal inertia; small echanical strength, low vibration resistance and low thermal-shock; relatively big volume of the element, which occupies larger space and is not easy to install; difficulty in carrying out the coplanar and curved-surface design between the controlling-temperature material and the electrothermal material; inadequate temperature-controlling effect and energy-saving effect; short life-span; side effect, which does harm to the health; low inoxidability; and bad manufacturability.

The problems with the traditional PTC (i.e. the abbreviation of Positive Temperature Coefficient) heater are as follows.

The traditional PTC heater connects several disk or honeycomb-fashion PTC elements and a radiator through splicing and holding, which generates an electrode and forms the subassembly of a heater. The connected PTC heating element subassembly is adhesive connected by silica gel with the corrugated neat sink strips. This structure causes unsteady transient output, easily becomes aged, crocks up transient output critically and noumenon has electrification, which possibly gives rise to short circuit or even fire.

Mechanical holding, instead of adhesive connecting, and integrally finned radiation can improve the radiating effect, which overcomes safety problems with the adhesive PTC, e.g. tackless, aged, noumenon electrification. But the surface temperatures of PTC electrothermal element are mainly at about 250° C., whereas, the leading of holding and electrode is utter significant. Besides poor contact, short circuit and unevenly distribution of electric field, the puncturing caused by partially overheat, owing to the mechanical poor contact, must be avoided.

When several elements are series connected, the distribution of the voltage changes promptly, owing to the differences of the characteristics and temperature—rising of the elements, which gives rise to a vicious circle. The elements, which have high voltage drop and rising temperature, are likely to break down and have a chain reaction. Therefore, the election of the elements is fairly important in series connection.

When several elements are parallel connected, the power of the system will increase within its limitation. But after the confirmation of the system, the radiating power of several elements does not amount to the total radiating power of every element. Actually, it is much less than the total. In parallel connection, there will be a strong impact current several minutes after electrification. Owing to the discreteness of the elements, the rate of the temperature rising of each element varies. As a consequence, an impact current does not amount to the total number of each impact current, but is less than the total number. Nonetheless, the element with less impact current should be elected in parallel connection.

According to the international requirement, the reliable experiment of the PTC heating element is that in the windless situation, the voltage attenuation is less than 8% when running 1,000 hours in the voltage rating. In reality, most of the voltage attenuations of the products are more than 15%. Owing to the problems above, the appliance of the series connected or parallel connected PTC heater is limited on a large scale.

In addition, the heating element of a current thick film circuit is a resistance element, which is lack of temperature controllability. The applied substrate falls into two categories. The first one is a high-temperature cofired ceramics electrothermal element. It is prepared though directly printing the resistance paste on the greenpressing of the alumina ceramics, laminating and batching out; then jointly burning at about 1,600° C. The new mid- and low-temperature heating element is a brand new product, following the heating alloy, the galvanothermy tube and the PTC heater element. This kind of heater element with 96 $Al_2O_3$ ceramics substrate is a new product. But the common demerits of the ceramics substrate are high brittleness, low mechanical shock resistance and thermal-shock resistance and the outer size can merely be length≦120 mm width≦100 mm thickness 0.5-1.5. Owing to the art limitation, the sizes of current products are merely 70×20, 70×15, 70×10. The heat surface power in real test is ≦25 w/$cm^2$. Owing to the size limitation of the ceramics substrate and the bad machining property, the product cannot be printed, incised and installed on a large scale. The usage of ceramics substrate is so unitary that it cannot overcome complicated problems such as electromagnetic interference. Therefore, there is so extensive a limitation to the range of appliance that it cannot lead the trend and be widely utilized The other one is 430 stainless steel (National Standard Number 1Cr17) substrate. At present, only Dupont, Est in the U.S and Heraeus in Germany and a few other companies have already mastered the serial paste manufactory art, whose thick film circuit substrate is American Trademark 430 (stainless steel 1Cr17). Furthermore, the said serial paste does not relate to the PTC electronic paste. The made electrothermal element is resistance electrothermal element, therefore, the electrothermal element does not have temperature controllability.

Because 1Cr17 is only an ordinary pure high ferritic stainless steel, whose quality coefficient of carbon is about 0.1% and which contains a small quantity of nitrogen. 1Cr17 is much larger compared with austenitic stainless steel. The demerits of 1Cr17 are delicate material, bad mechanical processing technique and welding procedure, which largely limit its appliance. Austenitic 1Cr18Ni9 serial stainless steel, however, has high plasticity and toughness. Therefore, an Austenitic 1Cr18Ni9 serial stainless steel has a good kinking, curling and punching forming, and a good mechanical processability so that it can be made into components, containers or pipelines of different shapes. Therefore, it is inevitable that a controllable electrotermal element of a thick film circuit with 1Cr18Ni9 serial stainless steel substrate is the trend of the art development.

SUMMARY OF THE INVENTION

The purpose of the present invention is to provide a controllable electrothermal element of PTC thick film, based on 1Cr18Ni9 serial substrate, which is temperature controllable, quick response, temperature controlling automatically, high power density, low-pressure start, low cost, small volume, safe, convenient and energy saving.

The present invention fulfills the above purposes through the following proposals:

A controllable electrothermal element of a PTC thick film circuit comprises a substrate and a serial electronic paste, the serial electronic paste is prepared on the substrate, the said serial electronic paste comprises a medium paste and an electrode paste and PTC paste. The said substrate is 1Cr18Ni9 series stainless steel substrate. The serial electronic paste in the form of thick film is prepared on the substrate. The serial electronic paste is consists of three parts that are functional phase, inorganic adhesive phase and organic carrier.

The inorganic adhesive phase of the medium paste is borosilicate and aluminum silicate, and the organic carrier of the inorganic adhesive phase of the medium paste is the main solvent, which is terpilenol or tributyl citrate. The composition of said functional phase of the medium paste is as follows: $CaO$—$Al_2O_3$—$SiO_2$—$B_2O_3$ and additive $TiO_2$: 2~10%, $ZrO_2$: 2~8%, CaO: 35~45% (the contents of calcium oxide at certain temperature); the medium paste of different swell factors at a certain temperature are prepared by controlling the contents of the additive; said medium paste and serial austenitic stainless steel can produce the substrate of the serial insulating radiating product; said medium paste and serial ferritic stainless steel can make up the substrate of the serial insulating radiating product.

The inorganic adhesive phase of the said PTC paste is oxide, which is $CuO$ or $Co_2O_3$. The organic carrier of the said PTC paste is a thickener, which is ethyl cellulose or nitrocellulose; the composition of said functional phase of the said PTC paste is as follows: main composition (Ba: 50~63%, Pb: 20~33%, Ca: 8~13%) $TiO_3$+X % $Nb_2O_5$ or $Y_2O_3$, wherein X is mol/mol and X=0.14~0.18, and mineral supplement AST (i.e. ceramic-glass), $Sb_2O_3$, $Li_2CO_3$, $Mn(NO_3)_2$; the Curie point moves to high temperature side or low temperature side through adding different impurities and replacing Ba in $BaTiO_3$ with Zr, Sr, Cu, Pb, Sn etc; the controllable electrothermal element of PTC thick film circuit is seriated at the temperature range from 30 to 400° C.

The inorganic adhesive phase of the said electrode paste is a mixture of oxide and ceramic-glass. The organic carrier of the said electrode paste is auxiliary solvent, which is surfactant or thixotropic agent. The composition of the functional phase of the said electrode paste is as follows: $Bi_2O_3(TiO_2)$: 2~6%, Ag(fine): 60~70%, Ag(piece): 20~40%, Pd(fine): 2~9%.

The feature of the PTC medium paste, PTC resistance phase, and PTC electrical conductor, which are prepared though the above composition, is that they are made from functional phase subassembly and inorganic adhesive phase, organic solvent carrier, which are prepared in proportion according to manufactural technololy, and prepared on the 1Cr18Ni9 serial stainless steel substrate in terms of thick film circuit, and therefore, the controllable electrothermal element of a PTC thick film circuit, based on stainless steel substrate, is made.

Compared with the traditional electrothermal element, the present invention provides a lot of functional advantages: the controllable electrothermal element of a PTC thick film is commonly called self temperature-controlling electrothermal member (or self temperature determining electrothermal member). In the process of releasing heat generated by electricity, the delivered output can adjust according to the real temperature of the heating system without any extra equipment in order to keep and control the temperature. The controllable electrothermal element of PTC thick film is a kind of intelligence material and has a promising future.

1. High power density. The power density of a PTC thick film circuit is generally 40-60 $W/cm^2$. If in the forced cooling condition, its power density can even reach 200 $W/cm^2$, which is 10 times more than the heating alloy material in the household electric heating appliances. High power density means that the thick film circuit with the same power has not only a smaller external size, but also a low-pressure start.

2. Quick response. The toggle speed of the thick film circuit is unusually fast. According to the tests, the surface heating rate of the resistive film can reach 200-300° C./s, which the heating alloy element cannot achieve. This edge enables the controllable electrothermal element of the thick film circuit to apply to high start implement, e.g. electric warmer, electric water heater and low voltage appliances, such as 12V, 24V, and 48V.

3. High mechanical strength, vibration resistance and thermal-shock resistance. Unlike the heating alloy material, this kind of thick film circuit does not generate brittleness when the temperature is high. The film of the electrothermal element of a thick film circuit has a good cementing property with stainless steel substrate. Therefore, the electrothermal element of thick film a can avoid mechanical shock and thermal shock and distortion or collapse caused by improper support and installment or its weigh.

4. Controllable heating temperature field. The circuit locus of the electrothermal element of a PTC thick film can be designed to the will so that the uniformity of the temperature field can be controlled according to the heating implement. And there is no blind area of heating.

5. Controllable heating temperature, temperature automatically balancing, temperature automatically determining and safe and reliable running. According to the feature of the PTC thick film circuit, the different designs of the serial product of $T_C$ (Curie point) point temperature of the electrothermal element can satisfy customers' different needs of the temperature balancing and temperature determining.

6. Controlling randomly and automatically temperature compensation. PTC thick film circuit heater can promptly adjust the heating power with positive or negative compensation in order to maintain the balance of the temperature when the system temperature fluctuates on a large scale owing to the external factors.

7. Cramped external structure. The eletrothermal element has a flat and ultra-thin external size. After the appliance of LTCC (low temperature cofired ceramic), the electrothermal element of a thick film circuit can be made into curved surface, and easy to tridimensionally heat up, install and utilize. If combined with resistive thick film circuit, the electrothermal element can not only expand the appliance field of the controllable electrothermal element of a thick film circuit, but also increase the automatic controlling degree and appliance range of the electrothermal element of a controllable thick film circuit.

8. Long life-span. The traditional heating alloy can easily be oxidized and its life span cannot exceed 3,000 hours. But the life span of the electrothermal element of a thick film circuit can reach at least 15,000 hours.

9. Energy-saving. With the conductibility of the stainless steel and optimization design of the electrothermal structure, the heat generated by the electrothermal element of a thick film circuit can be utilized maximally and the waste of heat is little. Compared with the traditional electrothermal element (e.g. electrothermal pipe, PTC element, electric stove, etc), the energy saving reaches 10-30%.

DESCRIPTION OF THE DRAWINGS

The present invention will be further illustrated by the following drawings and detailed description of the preferred embodiments.

FIG. 1 is the structure diagram of the invention.

DETAILED DESCRIPTION OF THE PREFERRED EMBODIMENTS

As depicted in FIG. 1, the present invention comprises 1Cr18Ni9 stainless steel 1, serial electronic paste, the said serial electronic paste comprises medium paste 2, PTC paste 3, electrode paste 4, medium paste 2, medium paste 2, which, in terms of a circuit, prints on the surface of the 1Cr18Ni9 stainless steel substrate 1 and is fired to be a compact film with certain thickness, and provides an insulating barrier between PTC layer, conductor layer and stainless steel substrate 1. The PTC paste 3 is prepared on the outside surface of medium paste 2; electrode paste 4 is prepared on the two ends of the circuit and the outside surface of the PTC paste 3, which are mainly the connecting between resistance and resistance and the connecting between resistance and external electric power.

The serial electronic paste consists of three parts: functional phase, inorganic adhesive phase and organic carrier, wherein the inorganic adhesive phase and organic carrier of the serial electronic paste are made by the following material, e.g. the inorganic adhesive phase of the medium paste 2 is borosilicate or aluminum silicate; its organic carrier is main solvent, which is terpilenol or tributyl citrate; the inorganic adhesive phase of the electrode paste 4 is a mixture of oxide and glass; the organic carrier of the electrode paste 4 is auxiliary solvent, which is surfactant or thixotropic agent. The composition of the functional phase of the medium paste 2 is as follows: $CaO$—$Al_2O_3$—$SiO_2$—$B_2O_3$ (the usage of the needed oxide weighs on the electronic balance in proportion to the elements of the glass, and the norm of the oxide is chemically pure or analytically pure) and additive $TiO_2$: 3%, $ZrO_2$: 7%, CaO: 40%; the composition of the said PTC paste is as follows: main solvent (Ba: 50-63%, Pb20-33%, Ca: 8-13%) $TiO_3$+X % $Nb_2O_5$ or $Y_2O_3$ (X is mol/mol, and X=0.14-0.18) and mineral supplement AST, $Sb_2O_3$, $Li_2CO_3$, $Mn(NO_3)_2$ (adopting the analytically pure material of the national standard); the composition of the functional phase of the said electrode paste 4 is as follows: Ag (fine, i.e. powder, sold) 60-68%, Ag (piece, i.e. piece, sold): 25-34%, Pd (fine, i.e. powder, sold): 0.8-4%. The feature of the PTC medium paste, PTC resistance phase, and PTC electrical conductor, which are prepared though the above composition, is that they are made from functional phase subassembly and inorganic adhesive phase, organic solvent carrier, which are prepared in proportion according to manufactural technology, and prepared on the 1Cr18Ni9 serial stainless steel substrate in terms of thick film circuit, and therefore, the controllable electrothermal element of a PTC thick film circuit, based on stainless steel substrate, is made.

TABLE 1

The Composition of the Serial Electronic Paste of the Present Invention.

| Functional Phase | Medium | PTC | Electrode (Electrical Conductor) |
|---|---|---|---|
| | Glass, Glass-Ceramics BaTiO3 | TiO3, Ba, Pb, Ca | Au, Pt/Au, Cu, Ni, Ag, Ag/Pd, Ag/Pt |
| Inorganic Adhesive Phase | Glass Borosilicate, Aluminum Silicate | Oxide CuO, Co2O3, Glass | Mixture Glass + Oxide |
| Organic Carrier | Main Solvent Terpilenol, Tributyl Citrate | Thickener Ethyl Cellulose Nitrocellulose | Auxiliary solvent Surfactant Thixotropic Agent |

TABLE 2

The Performance of the PTC Paste (Heater) ($TiO_2$ purity $\geq$ 99.8%)

| $\rho 25°$ C/$\Omega$cm | Tc/% | Rmax/Rmin | $\alpha 40$/%° C. − 1 | Pressure-Proof Umax/V |
|---|---|---|---|---|
| 106.6 | 260 | 6.5 × 103 | 15.9 | 110 |

The electric property reaches Chinese National Standard GB4706.1-98 standard. Details are as following:

Disruptive strength: >1,500VAC

Insulating resistance: >20MΩ (500VDC)

Leakage current: ≦2 MA (250VDC)

The Austenitic 1Cr18Ni9 serial stainless steel used by the present invention has an unusually high plasticity and toughness so that it has a good kinking, curling and punching forming in order to be made into different shapes of components, containers or pipelines. Owing to this, the present invent chooses 1Cr18Ni9 serial stainless steel as the substrate of the thick film circuit and manufactures serial thick film electronic paste, which directly applies to 1Cr18Ni9 serial stainless steel substrate, including medium paste, PTC paste and conductive paste.

The controllable electrothermal element of a PTC thick film circuit refers to the electrothermal element of a thick film circuit, which is prepared by the PTC serial paste. The controllable electrothermal element of a PTC thick film circuit is a semiconductor radiating element of positive temperature coefficient, which belongs to the compound of the bariumtitanate ($BaTiO_3$) series, mingles with traces of the lanthanon and is sintered according to the manufactural technology. The resistance of the semiconductor declines as the temperature goes up. The semiconductor presents NTC property, i.e. negative-temperature effect. And the exceptional change phenomenon of this kind of impedance is called PTC effect. The surface temperature of the PTC electrothermal element is mainly at around 250° C. The Curie point moves to high temperature side or low temperature side through added different impurities and replacing Ba in BaTiO$_3$; the controllable electrothermal element of a PTC thick film circuit is seriated at the temperature range from 30 to 400° C. Owing to this, the present invention chooses PTC paste, in terms of a thick film circuit, is prepared on the stainless steel substrate, and manufactures the controllable electrothermal element of a thick film circuit, based on 1Cr18Ni9 serial stainless steel, and seriates its products. Manufacturing this controllable element of the serial thick film circuit of PTC effect is a new practice and development.

The invention claimed is:

1. A controllable electrothermal element of a PTC thick film circuit comprises:

a substrate and a serial electronic paste, the serial electronic paste is prepared on the substrate, said serial electronic paste comprises a medium paste and an electrode paste, the serial electronic paste includes three parts, a functional phase, an inorganic adhesive phase and an organic carrier, the inorganic adhesive phase of the medium paste is borosilicate and aluminum silicate, and the organic carrier of the inorganic adhesive phase of the medium paste is the main solvent;

the inorganic adhesive phase of the electrode paste is the mixture of oxide and glass and the organic carrier is auxiliary solvent, wherein said serial electronic paste further comprises PTC paste, said substrate is 1Cr18Ni9 series stainless steel substrate, the serial electronic paste is in the form of thick film and is prepared on the substrate;

the composition of said functional phase of the medium paste is CaO—Al$_2$O$_3$—SiO$_2$—B$_2$O$_3$ and additive TiO$_2$: 2~10% by weight, ZrO$_2$: 2~8% by weight, CaO: 35~45% by weight;

said medium paste and serial austenitic stainless steel comprises the substrate for a serial insulating radiating product;

the substrate of the serial insulating radiating product includes said medium paste and serial ferritic stainless steel;

the inorganic adhesive phase of said PTC paste is oxide and its organic carrier is a thickener;

the composition of said functional phase is main composition (Ba: 50~63% by weight, Pb: 20~33% by weight, Ca: 8~13% by weight) TiO$_3$+X % Nb$_2$O$_5$ or Y$_2$O$_3$, wherein X is mol/mol and X=0.14~0.18, and mineral supplement AST, Sb$_2$O$_3$, Li$_2$CO$_3$, Mn(NO$_3$)$_2$;

a Curie point moves to high temperature side or low temperature side through adding different impurities and replacing Ba in BaTiO$_3$;

the controllable electrothermal element of the PTC thick film circuit is seriated at a temperature range from 30 to 400° C.;

the composition of the functional phase of said electrode phase is Bi$_2$O$_3$(TiO$_2$): 2~6% by weight, Ag(fine): 60~70% by weight, Ag(piece): 20~40% by weight, Pd(fine): 2~9% by weight.

2. The controllable electrothermal element of a PTC thick film circuit of claim 1, wherein said oxide of the PTC paste of the inorganic adhesive is CuO or Co$_2$O$_3$, said thickener of the organic carrier is ethyl cellulose or nitrocellulose, the main solvent of the organic carrier of said medium paste is terpilenol or tributyl citrate, the auxiliary solvent of the organic carrier of the electrode paste is a surfactant or a thixotropic agent.

3. The controllable electrothermal element of a PTC thick film circuit of claim 1, wherein the PTC paste is coupled on an outside surface of the medium paste.

4. The controllable electrothermal element of a PTC thick film circuit of claim 3, wherein the electrode paste is formed on two ends of the PTC thick film circuit and outside surface of the PTC paste.

* * * * *